United States Patent
Lee et al.

(10) Patent No.: US 8,592,304 B2
(45) Date of Patent: Nov. 26, 2013

(54) METHOD FOR FILLING METAL

(75) Inventors: Chang-Hsiao Lee, Tainan County (TW);
Yu-Tsung Lai, Tai-Chung Hsien (TW);
Jiunn-Hsiung Liao, Tainan Hsien (TW)

(73) Assignee: United Microelectronics Corp.,
Science-Based Industrial Park, Hsin-Chu (TW)

( * ) Notice: Subject to any disclaimer, the term of this patent is extended or adjusted under 35 U.S.C. 154(b) by 379 days.

(21) Appl. No.: 12/757,017

(22) Filed: Apr. 8, 2010

(65) Prior Publication Data

US 2011/0250751 A1   Oct. 13, 2011

(51) Int. Cl.
*H01L 21/31* (2006.01)
*H01L 21/469* (2006.01)

(52) U.S. Cl.
USPC ............... 438/637; 438/618; 257/E21.576; 257/E21.577

(58) Field of Classification Search
None
See application file for complete search history.

(56) References Cited

U.S. PATENT DOCUMENTS

| 6,337,269 | B1 | 1/2002 | Huang | |
|---|---|---|---|---|
| 7,750,479 | B2 * | 7/2010 | Purushothaman et al. | ... 257/774 |
| 2005/0176604 | A1 * | 8/2005 | Lee et al. | ...... 510/175 |
| 2006/0270214 | A1 * | 11/2006 | Iba | ............ 438/637 |
| 2008/0153283 | A1 * | 6/2008 | Abdelrahman et al. | ...... 438/618 |
| 2010/0105205 | A1 * | 4/2010 | Lee et al. | ...... 438/656 |

* cited by examiner

*Primary Examiner* — Zandra Smith
*Assistant Examiner* — Pamela E Perkins
(74) *Attorney, Agent, or Firm* — Winston Hsu; Scott Margo

(57) ABSTRACT

A method for filling a metal is disclosed. First, a substrate is provided. The substrate includes a metal material layer, a dielectric layer covering the metal material layer and a hard mask layer covering the dielectric layer. The hard mask layer has at least one opening to expose the underlying dielectric layer. Second, a dry etching step is performed to etch the dielectric layer through the opening to remove part of the dielectric layer to expose the metal material layer and to form a recess and leave some residues in the recess. Then a cleaning step is performed to remove the residues and to selectively remove part of the hard mask to substantially enlarge the opening. Later, a metal fills the recess through the enlarged opening.

15 Claims, 4 Drawing Sheets

METHOD FOR FILLING METAL

BACKGROUND OF THE INVENTION

1. Field of the Invention

The present invention generally relates to a method for filling a metal in a narrow recess. In particular, the present invention is directed to a method for filling a metal in a narrow recess through a cleaning step to simultaneously remove residues in the recess and to substantially enlarge the opening of the recess at the same time.

2. Description of the Prior Art

In the standard semiconductor process, a material such as W or Cu is frequently used to fill up a hole to form a bridge for electrical connection, such as elements called conductive plugs or via plugs. This standard semiconductor process is getting more and more difficult as the critical dimension of the semiconductor elements is shrinking.

For example, in a substrate with a metal material layer and a dielectric layer covering the metal material layer a conductive medium is needed to be formed to penetrate the dielectric layer so that the metal material layer which is beneath the dielectric layer may form an upward electrical connection, or a via plug for use in a damascene structure may be formed. FIGS. 1-4 illustrate a conventional method to form a via. First, as shown in FIG. 1, a substrate 101 is provided. There is a metal material layer 110 in the substrate and a dielectric layer 120 covers the substrate 101. The dielectric layer 120 entirely covers the underlying metal material layer 110. Second, as shown in FIG. 2, a patterned photoresist layer 130 is formed on the dielectric layer 120 in advance. Next, as shown in FIG. 3, the patterned photoresist layer 130 formed in advance is used in an etching step to etch the dielectric layer 120. The resultant via 121 must expose the underlying metal material layer 110 which is deeply buried in the dielectric layer 120. Later, as shown in FIG. 4, a conductive material 122, such as Cu fills the resultant via 121 to form the needed conductive medium by methods such as deposition, sputtering or electroplating . . . etc.

The above-mentioned procedures are not too difficult when the critical dimension of the semiconductor elements has not been decreased too much, so the yield is stable and acceptable. However, it is getting more and more difficult to fill the via with the conductive material 122 and the yield drops quickly since the critical dimension of the semiconductor elements is decreasing too much. In particular, it is found that there are often voids 123 which seriously jeopardize the conductivity of the via 121 in the via 121 filled with the conductive material 122, as shown in FIG. 4. Accordingly, the conductive material 122 cannot serve as a proper conductive medium as expected.

On the other hand, the afore-mentioned etching step also leaves some problematic residues 124 in the via 121, as shown in FIG. 3. As the critical dimension of the semiconductor elements is downscaling, it is getting harder and harder to completely get rid of the residues 124. The residues 124 which block the via 121 not only adversely affect the performance of the conductive material 122 in the via 121, but also block the bottom of the via 121 so that a good electrical connection between the conductive material 122 and the underlying metal material layer 110 cannot be properly formed, and further, the device as a result fails. These problems still need to be resolved.

SUMMARY OF THE INVENTION

The present invention therefore proposes a method for filling a metal. The method of the present invention is not only able to properly fill up a narrow hole with a metal, but also to clean up the residues in the narrow hole, to ensure a correct electrical connection to be constructed. Because the method of the present invention is particularly suitable for use in filling a narrow hole with a small opening, the method of the present invention is particularly versatile.

A method for filling a metal is disclosed. First, a substrate is provided. The substrate includes a metal material layer, a dielectric layer covering the metal material layer and a hard mask layer covering the dielectric layer. The hard mask layer has at least one opening to expose the underlying dielectric layer. Second, a dry etching step is carried out to etch the dielectric layer through the opening to remove part of the dielectric layer to form a recess and leave some residues in the recess. Then, a cleaning step is carried out to remove the residues and to selectively remove part of the hard mask to substantially enlarge the opening. Later, a metal fills up the recess through the enlarged opening after a barrier layer is formed in the recess.

The cleaning step in the method of the present invention usually includes a wet etching. Still, because the cleaning step substantially does not damage the metal material layer, the following electric connection is not substantially influenced.

In one aspect of the present invention, the enlarged opening and the dielectric layer may together form a ladder-like shape. In another aspect of the present invention, the size of the opening may not be larger than 90 nm, but the size of the enlarged opening may be at least 30% larger. For example, a 90 nm opening becomes a 117 nm opening larger.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
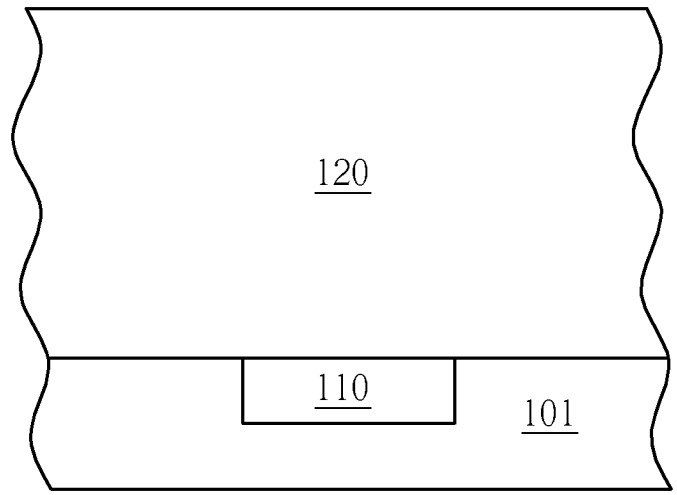
FIGS. 1-4 illustrate a conventional method to form a via.
Figure 2:
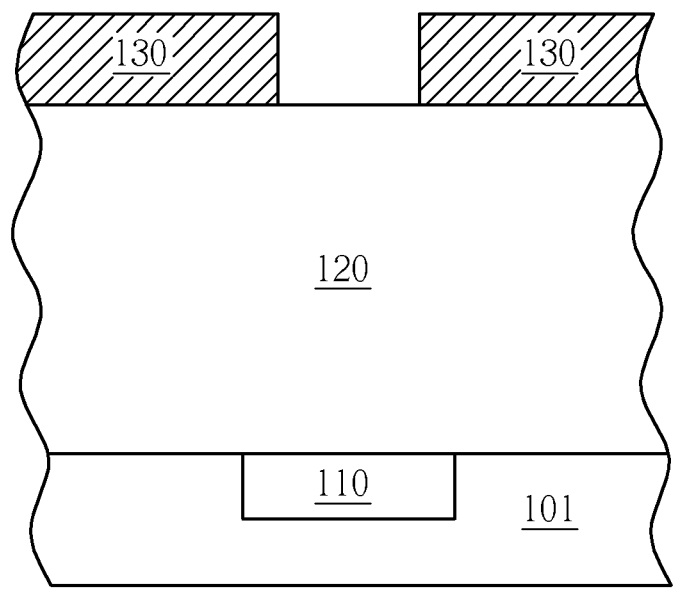
Figure 3:
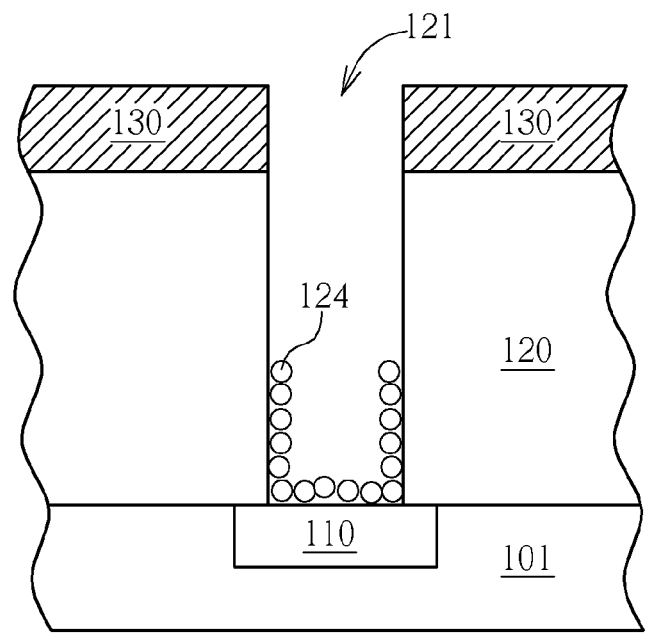
Figure 4:
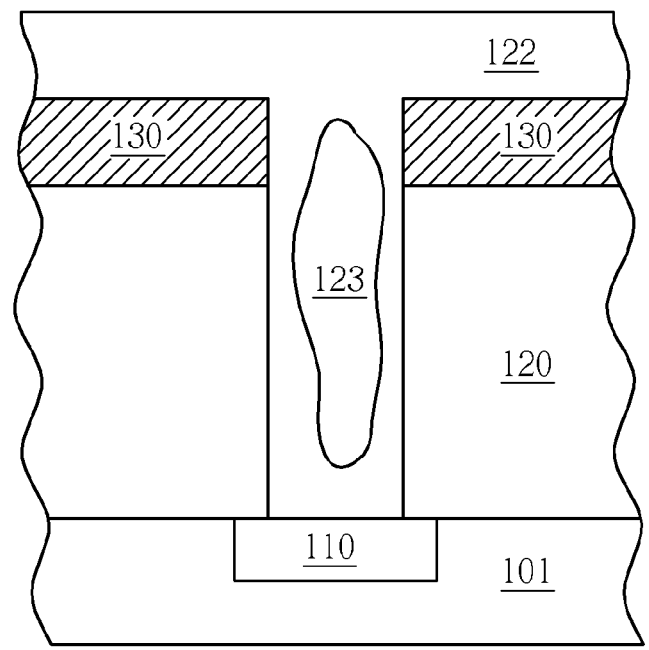
Figure 5:
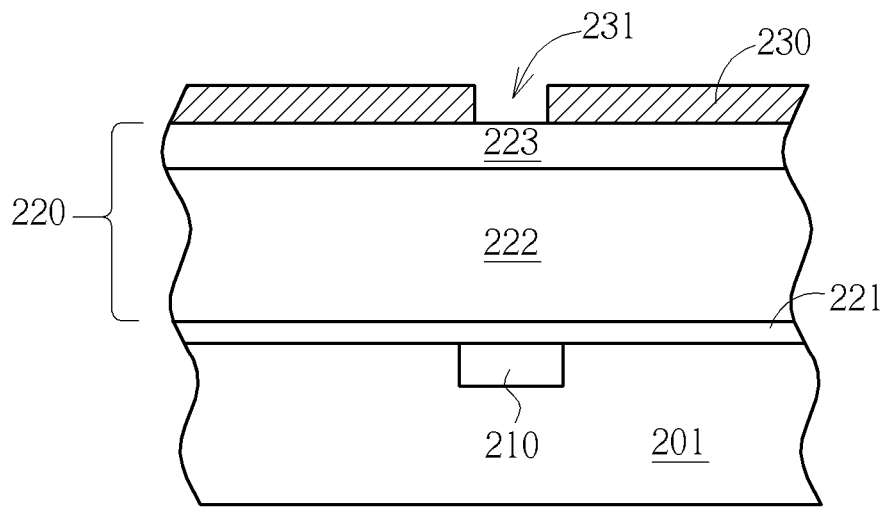
FIGS. 5-8 illustrate the method of the present invention to fill a hole with a metal.

The present invention provides a novel method for filling a metal. The method of the present invention is particularly suitable for use in filling a narrow hole with a small opening, such as contact holes or vias in a damascene structure. In one aspect, the method of the present invention can clean up the residues in the narrow hole due to the dry etching method. In another aspect, the method of the present invention can ensure a correct electrical connection to be constructed. Consequently, the method of the present invention is particularly versatile.

The present invention provides a novel method for filling a metal in a narrow hole, in particular with a small opening. FIGS. 5-8 illustrate the method of the present invention to fill a hole with a metal. First, please refer to FIG. 5, a substrate 201 is provided. The substrate 201 includes at least a metal material layer 210. There are a pad layer 221, a dielectric layer 220 and a hard mask layer 230 on the substrate 201. The dielectric layer 220 completely covers the metal material layer 210. The hard mask layer 230 may have undergone a patterning procedure. For example, a patterned photoresist (not shown) may be used in an etching step to transfer the pattern, such as a via pattern in a single damascene structure or a dual damascene structure, in the patterned photoresist into the hard mask layer 230 so that the hard mask layer 230 may have at least one opening 231. At this time, the opening 231 exposes the underlying dielectric layer 220. When semiconductor elements with a smaller critical dimension are present, such as the size of the opening 231 is not larger than 90 nm, the method of the present invention is still suitable to fill a hole with a metal.

The metal material layer 210 may be a material layer which includes metal component(s), for example conductive wires, or any part to be electrically connected, such as gates, sources/drains covered with silicide, or interconnections . . . etc. The dielectric layer 220 may be a composite material layer including for example a low-k dielectric layer 222 and a nitride layer 223 such as silicon nitride. The nitride layer 223 is usually disposed directly under the hard mask layer 230. The low-k dielectric layer 222 and the pad layer 221 directly cover the metal material layer 210. The hard mask layer 230 usually includes a material including metal, such as titanium nitride.

Figure 6:
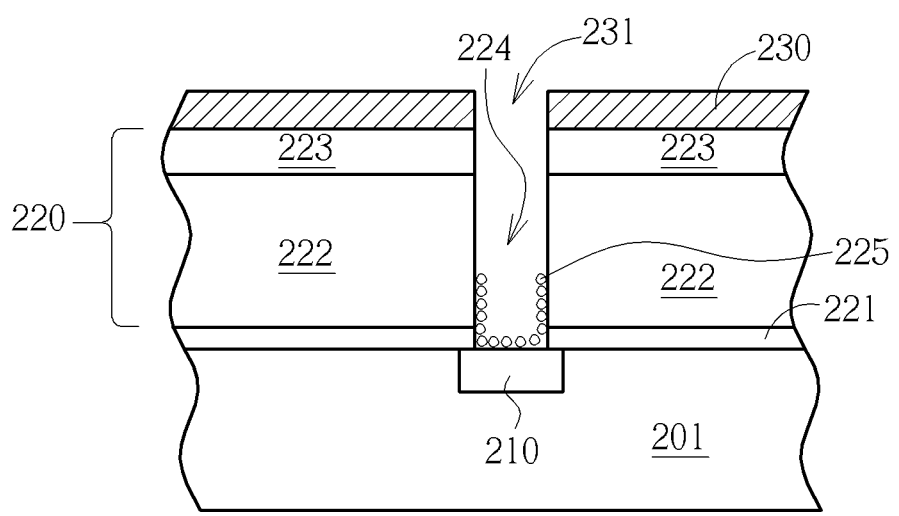

Second, please refer to FIG. 6, a dry etching step is carried out. The dry etching step removes some of the dielectric layer 220 through the opening 231 of the hard mask layer 230. In one aspect, when some of the dielectric layer 220 is removed, a recess 224 is formed in the dielectric layer 220. In another aspect, the dry etching step may inevitably leave some residues 225 which cover the metal material layer 210 in the recess 224. Generally speaking, such residues 225 are not easily removed by traditional cleaning methods.

Please note that, as shown in FIG. 6, the dry etching step penetrates the pad layer 221 to expose the underlying metal material layer 210.

Figure 7:
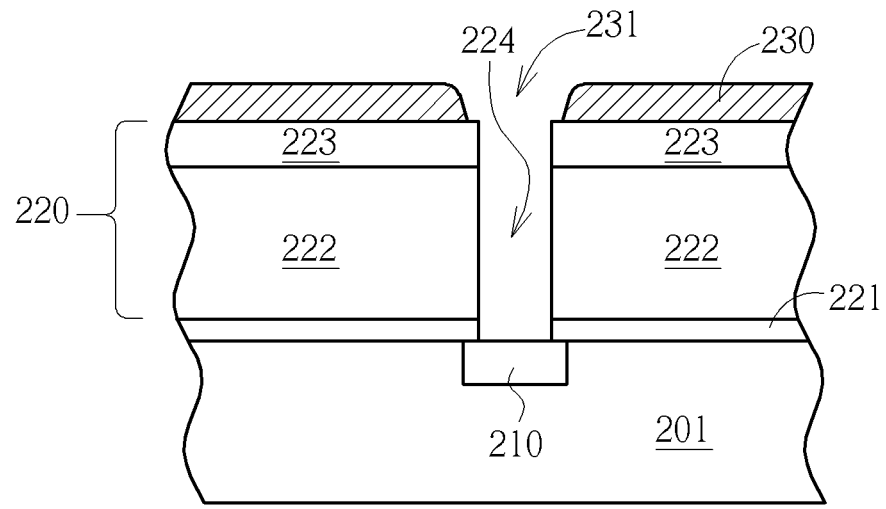

Next a cleaning step is carried out, as shown in FIG. 7. The single cleaning step of the present invention may bring forth multiple advantageous results. To begin with, the cleaning step of the present invention removes the adverse residues 225 in the recess 224. Generally speaking, such residues 225 are not easily removed by traditional cleaning methods. Moreover, the cleaning step of the present invention may selectively remove the adverse residues 225 in the recess 224. In other words, the cleaning step of the present invention does not substantially influence, i.e. remove the low-k dielectric layer 222.

Additionally, the cleaning step of the present invention does not substantially damage the metal material layer 210, so the following electric connection is not influenced. In such a way, the residues 225 will not jeopardize the following electrical connection to be formed.

Further, the cleaning step of the present invention may also partially remove the hard mask layer 230. After part of the hard mask layer 230 is removed, as shown in FIG. 7, it represents a substantially enlarged opening 231. A larger opening 231 positively facilitates the filling of a material into the recess 224 without being bound by some objective conditions that the opening 231 of the recess 224 is too small or its aspect ratio is too large. In one embodiment of the present invention, the size of the enlarged opening 231 is at least 30% larger. For example, a 90 nm opening becomes a 117 nm opening larger.

The cleaning step of the present invention usually includes a wet etching step. The etchant used in the wet etching step should be able to enlarge the opening and clean up the residues 225 at the same time. The etchant may be a mixture of sulfuric acid, fluoride, hydrogen peroxide and DI water. For example, the etchant may contain (wt %) 0.001-7% sulfuric acid, 0.5-250 ppm fluoride, 0.5-50% hydrogen peroxide and 43-99.9% DI water. The size of the enlarged opening 231 can be controlled by the etching time. As shown in FIG. 7, the enlarged opening 231 and the dielectric layer 220 may together form a ladder-like shape.

Figure 8:
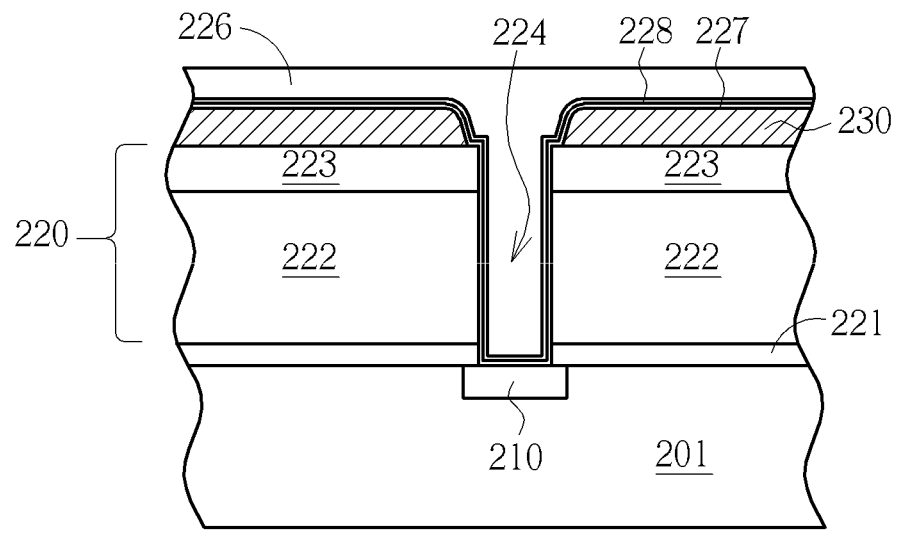

Later, please refer to FIG. 8, a metal 226 can fill up the recess 224 through the enlarged opening 231. The recess 224 may be filled with various metals, such as at least one of Al, W and Cu. If the recess 224 is filled with Cu, a metal layer 226 may be formed by an electroplating procedure. Optionally, before the metal 226 fills up the recess 224, other material layers may be deposited in advance. For example, a barrier layer 227 may be deposited in the recess 224 in advance. Besides, a seed layer 228 may be deposited between the metal layer 226 and the barrier layer 227. The metal layer 226 may be any element located in a hole, such as a conductive plug or a via plug in a damascene structure. Since the present invention provides a narrow hole with an enlarged opening, overhangs (not shown) often occurring in a depositing procedure or an electroplating procedure are not so disadvantageous and the electrolyte solution (not shown) may enter the recess 224 much more easily.

Afterwards, excess metal layer 226 may be optionally removed to precede various following procedures. The details are known to persons of ordinary skills in the art so will not be elaborated here.

The single cleaning step of the present invention may bring forth multiple advantageous results. In addition to removing the adverse residues in the recess, the underlying metal material layer is not damaged and the opening 231 of the recess 224 is enlarged after the cleaning step of the present invention so the method of the present invention not only cleans up the undesirable residues, but also helps correctly form a good electrical connection as expected and facilitates the filling of a material into a hole. The method of the present invention may demonstrate multiple advantageous results.

Those skilled in the art will readily observe that numerous modifications and alterations of the device and method may be made while retaining the teachings of the invention.

What is claimed is:

1. A method for filling a metal, comprising:
   providing a substrate comprising a metal material layer, a pad layer, a dielectric layer covering said metal material layer and a hard mask layer covering said dielectric layer, wherein said hard mask layer has at least one opening to expose the underlying dielectric layer;
   performing a dry etching step to etch said dielectric layer through said opening to remove part of said dielectric layer to expose said metal material layer and to form a recess and simultaneously leave some residues remaining in the recess;
   performing a cleaning step to remove the residues and to selectively and simultaneously remove part of said hard mask to substantially enlarge the opening of the hard mask layer while substantially not removing said dielectric layer, so that the enlarged opening of the hard mask layer and said dielectric layer together form a ladder-like shape; and
   filling the recess with a metal through the enlarged opening.

2. The method for filling a metal of claim 1, wherein said dielectric layer comprises a low-k dielectric layer and a nitride layer.

3. The method for filling a metal of claim 1, wherein said metal material layer substantially remains intact after said cleaning step.

4. The method for filling a metal of claim 1, wherein said hard mask layer comprises titanium nitride.

5. The method for filling a metal of claim 1, wherein the size of the opening is not larger than 90 nm.

6. The method for filling a metal of claim 1, wherein said residues covers said metal material layer.

7. The method for filling a metal of claim 1, wherein said cleaning step comprises a wet etching.

8. The method for filling a metal of claim 1, wherein said cleaning step comprises to use a mixture of sulfuric acid, fluoride, hydrogen peroxide and DI water.

9. The method for filling a metal of claim 1, wherein the size of the enlarged opening is 30% larger.

10. The method for filling a metal of claim 1, wherein the opening defines a damascene pattern.

11. The method for filling a metal of claim 10, wherein the damascene pattern is a dual damascene pattern.

12. The method for filling a metal of claim 1, further comprising:
    depositing a barrier layer in the recess in advance before filling said metal in the recess.

13. The method for filling a metal of claim 12, further comprising:
    depositing a seed layer between said metal and the barrier layer.

14. The method for filling a metal of claim 1, wherein said metal comprises at least one of Al, W and Cu.

15. The method for filling a metal of claim 1, wherein said metal is formed by electroplating.

\* \* \* \* \*